United States Patent
Eitrich

[11] Patent Number: 5,663,933
[45] Date of Patent: Sep. 2, 1997

[54] METER CIRCUIT

[75] Inventor: Frank-Thomas Eitrich, Reutlingen, Germany

[73] Assignee: Robert Bosch GmbH, Stuttgart, Germany

[21] Appl. No.: 640,834

[22] PCT Filed: Oct. 28, 1994

[86] PCT No.: PCT/DE94/01265

§ 371 Date: May 8, 1996

§ 102(e) Date: May 8, 1996

[87] PCT Pub. No.: WO95/13456

PCT Pub. Date: May 18, 1995

[30] Foreign Application Priority Data

Nov. 10, 1993 [DE] Germany .......... 43 38 343.2

[51] Int. Cl.[6] .......... G04F 8/00; G01R 7/00; H03M 1/30
[52] U.S. Cl. .......... 368/119; 324/140 R; 324/140 D; 377/20; 341/6; 341/11; 123/487
[58] Field of Search .......... 368/113-120; 324/140 R, 140 D; 341/1, 6, 11, 13; 123/414, 416, 478, 486, 487

[56] References Cited

U.S. PATENT DOCUMENTS

| | | | |
|---|---|---|---|
| 3,967,271 | 6/1976 | Day | 340/347 R |
| 4,133,323 | 1/1979 | Adler | 123/117 R |
| 5,264,844 | 11/1993 | Itou et al. | 341/11 |

FOREIGN PATENT DOCUMENTS 0233474  8/1987  European Pat. Off. .

Primary Examiner—Vit W. Miska
Attorney, Agent, or Firm—Kenyon & Kenyon

[57] ABSTRACT

The present invention relates to an electronic meter circuit for a time comparison measurement between two successive periodic events with which the signal time ratios between two times two successive events can be recognized by a simple method.

The electronic meter circuits comprises a reference meter to be loaded with a reset value when a first event occurs and for reference meter to start to count at a clock frequency and when a second event occurs, reference meter starts to count in the opposite direction at a clock frequency until a third event occurs, and when the third event occurs, meter reading forms a reference value for the ratio of the signal times between the occurrence of the first and second events and between the second and third events.

20 Claims, 1 Drawing Sheet

5,663,933

METER CIRCUIT

FIELD OF THE INVENTION

The present invention relates to an electronic meter circuit for a time comparison measurement between two successive periodic events.

BACKGROUND INFORMATION

It is known that in measuring the length of a signal or the time between the occurrence of two events, a clock signal of a certain frequency can be applied to the input of a meter circuit belonging to the comparator. By means of a gate, this clock pulse is switched through to the meter only during the signal time that is of interest but otherwise it is blanked out. Thus the meter does not continue to count during the blanked-out segment. If the meter is reset, preferably to zero, during the signal time that is not of interest, the meter reading corresponds approximately to the length of the signal. If the meter is not reset, the difference in meter readings corresponds to this signal length. To compare signal time ratios between two successive periodic events, at least two of these meter circuits are needed and interim storage of intermediate results is necessary when using only one meter circuit in registers. One disadvantage of this, in addition to the extra expense for components, is that a signal time ratio can be obtained only by subtracting the meter readings provided by the meter circuit, and these readings may be estimated as constants.

SUMMARY OF THE INVENTION

The electronic meter circuit according to the present invention allows the time rations between two times two events to be recognized. Due to the fact that a reference meter is loaded with a reset value when a first event occurs, and the reference meter starts to count at a first clock frequency, and when a second event occurs, the reference meter starts to count in the opposite direction at a second clock frequency until a third event occurs, and when a third event occurs, the meter reading forms a reference value for the ratio of the signal times between the occurrence of the first and second events and between the second and third events. The present invention allows, in a very simple and advantageous manner to resolve this time-based comparison measurement by counting in different directions and to deduce the ratio of the two signal times on the basis of the meter reading at the end of the comparison measurement.

In a another embodiment of the present invention, the reference meter is formed by two separate meters that have different counting directions. This yields another advantageous result that the meter supplying the signal time can be performing a new measurement while the second meter is performing the comparison measurement.

DETAILED DESCRIPTION OF THE INVENTION

Figure 1:
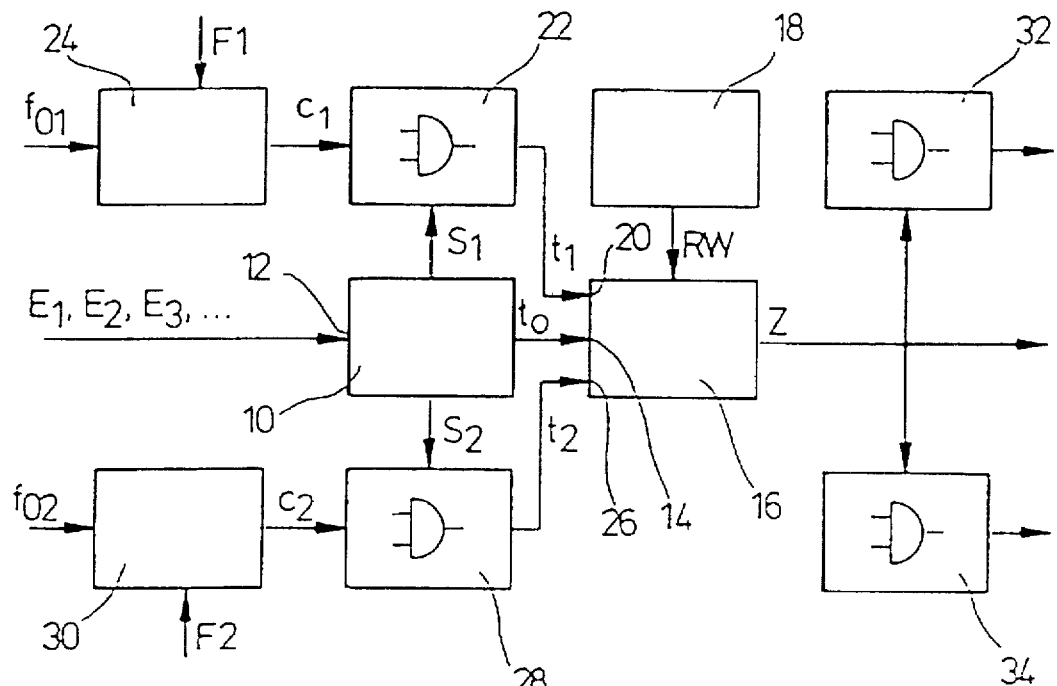
FIG. 1 shows a block schematic of an electronic meter circuit according to a first embodiment of the present invention.

The block schematic of the first embodiment shown in FIG. 1 has a control unit 10 that receives event signals E1, E2 and E3 via input 12. For example, event signals E may be generated by a generator wheel on the crankshaft of a combustion engine. Said generator wheel has teeth distributed over its circumference, with each of these teeth inducing an event signal E. However, event signals E can also be generated by a segment generator on the camshaft of a combustion engine, where a positive flank, for example, will generate a first event signal E1 and a negative flank will generate a second event signal E2, and the positive flank of the next segment generates a third event signal E3.

Control unit 10 is connected to a first input 14 of reference meter 16. When an event signal E1 occurs, control unit 10 delivers a signal t0 to reference meter 16, causing reference meter 16 to be loaded with reset value RW from a register 18. Reset value RW preferably has a value of zero. A second input 20 of reference meter 16 receives clock frequency t1 that is used by reference meter 16 to count up incrementally, starting with reset value RW. Clock frequency t1 is supplied by gate 22 that allows an input clock pulse C1 to pass through when gate 22 receives control signal S1 from control unit 10. Control signal S1 is triggered by control unit 10 when the first event signal E1 is received. This yields the result that reference meter 16 is loaded with reset value RW when the first event E1 occurs, and the meter counts at the same time with clock frequency t1. Clock frequency t1 triggers an operation for counting incrementally, preferably by a value of 1. Input clock pulse C1 is supplied by a frequency divider circuit 24, where a frequency f01 supplied by a control circuit (not shown) in a known way is estimated with a preselected frequency division ratio F1. Thus, frequency division ratio F1 can ultimately be used to influence clock frequency t1 at which reference meter 16 starts to count after event E1. When a second event E2 occurs, control unit 10 delivers a new signal t0 to reference meter 16 so that reference meter 16 stops the counting operation at clock frequency t1. At the same time, reference meter 16 receives clock frequency t2 via a third input 26. Clock frequency t2 causes reference meter 16 to count down, starting with the meter reading reached when event E2 occurred. A counting operation is triggered by an incremental value, preferably −1. Clock frequency t2 is supplied by gate 28 which puts input clock pulse C2 through as a function of a control signal S2 supplied by control unit 10. Control signal S2 is triggered by the occurrence of the second event E2. Input clock pulse C2 is supplied by frequency divider circuit 30 with the help of which frequency f02 supplied by a control circuit (not shown) is estimated with a preselected frequency division ratio F2. Thus, clock frequency t2 with which reference meter 16 counts down is determined by frequency division ratio F2.

When a third event E3 occurs, control unit 10 delivers another signal t0 to reference meter 16 so the latter stops its counting operation. When event E3 occurs, reference meter 16 thus has a certain meter reading Z. Reset value RW that is set when the first event E1 occurs is known, so it can be compared with meter reading Z at the time of event E3. If reference meter 16 counts up at the same clock frequency t1 and down at clock frequency t2, then a positive meter reading Z corresponds to the statement that the signal time between the first event E2 and the third event E3 is smaller than the signal time between the first event E1 and the second event E2.

A negative meter reading Z indicates that the signal time between events E2 and E3 is greater than the signal time between events E1 and E2. Clock frequencies t1 and t2 need not necessarily be the same, but instead can be selected using frequency division ratios F1 and F2, so the ratio of the signal times between events E1 and E2 or events E2 and E3 can be inferred from the ratio of clock frequencies t2 to t1. This means that the accuracy of the time comparison measurement depends only on clock frequencies t1 and t2 and not on event signals E supplied by a generator. The exact signal time ratio is characterized by reset value RW. Meter reading Z and optionally the intermediate meter reading when event E2 occurs may be sent to gates 32 and 34, for further analysis.

The described embodiment of the present invention is based on reset value RW having a value of zero and reference meter 16 being advanced from and returned to reset value RW with each incremental value. Since the lower bits of reference meter 16 are not taken into account, a "slightly larger ratio" function can be implemented when reset value RW is zero, so it may be possible to stipulate that the signal time between events E2 and E3 is somewhat larger than the signal time between events E1 and E2 without determining their exact values.

If reference meter 16 is started with a reset value other than zero, functions such as "somewhat smaller ratio" and "approximately the same ratio" can also be achieved. The accuracy range of these functions depends on the number of unused bits of reference meter 16 and preselected frequency division ratios F1 and F2, optionally programmable. The width of the "approximate ranges" depends only on clock frequency t2 and the accuracy of clock frequencies t1 and t2. In addition, other functions that depend on clock frequency t1 can be implemented by defining a reset value RW not equal to zero or by partially failing to reset reference meter 16 during the signal time between events E2 and E3.

Figure 2:
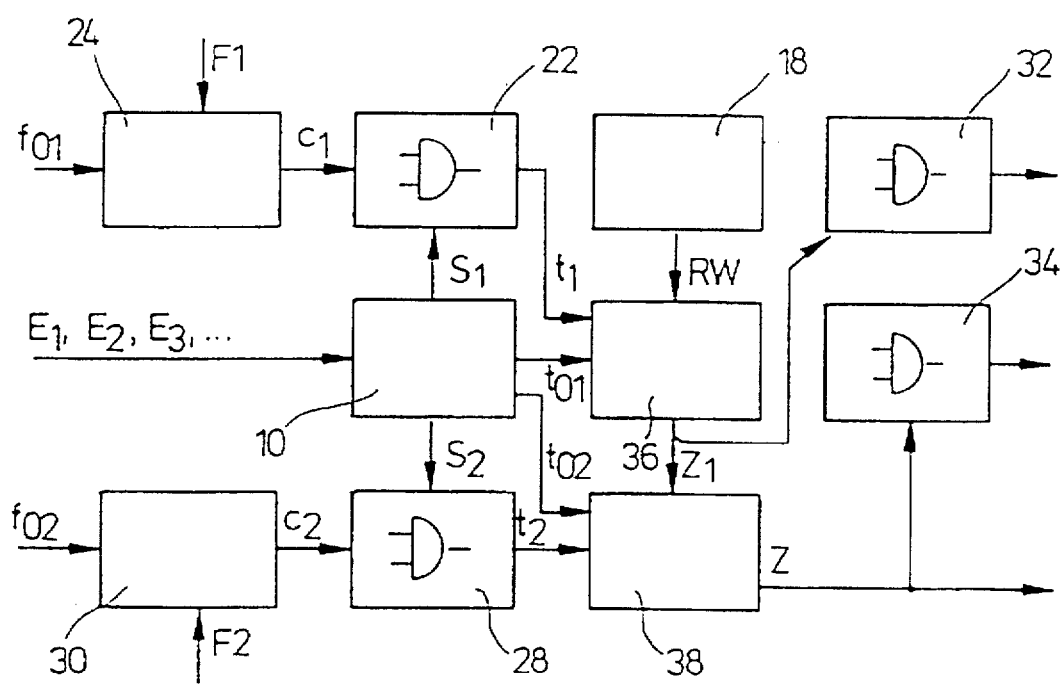
FIG. 2 shows a block schematic of an electronic meter circuit according to a second embodiment of the present invention.

FIG. 2 shows a block schematic of another embodiment of the present invention which is a variation of the first embodiment illustrated in FIG. 1. The same parts as in FIG. 1 are indicated with the same notation and are explained again herein. Instead of reference meter 16, there is a first meter 36 here that is loaded with reset value RW with a signal t01 from control unit 10 when event E1 occurs. Meter 36 then starts to count up at clock frequency t1. Instantaneous meter reading Z1 of meter 36 is transferred to a second meter 38 when the second event E2 occurs. The second meter 38 is started by signal t02 that represents the occurrence of the second event E2 and is delivered by control unit 10 and it counts down at clock frequency t2. As already described with regard to FIG. 1, when event E3 occurs, the second meter 38 then supplies a meter reading Z. This means that the first meter 36 can start immediately with a new signal time measurement due to the fact that the comparison measurement has been shifted to the second meter 38. Moreover, this is possible only if the meter reading of the first meter 36 was transferred to the second meter 38 on occurrence of event E2. Meter reading Z1 and meter reading Z can also be sent through gates 32 and 34 for further processing.

The meter circuits according to the present invention as shown in FIGS. 1 and 2 are only examples, so the counting directions can also be reversed. This means that reference meter 16 and the first meter 36 count down at clock frequency t1, and reference meter 16 and second meter 38 count up at clock frequency t2. In addition, it is also possible to design reference meter 16 as a meter with a mixed counting function, so it can be advanced and reversed simultaneously via applied clock frequencies t1 and t2.

I claim:

1. An electronic meter circuit for a time comparison measurement between a plurality of event signals, the electronic meter circuit comprising:

a control unit having a control input for accepting the plurality of event signals, the plurality of event signals including a first, a second and a third event signal;

a first frequency divider circuit coupled to the control unit for providing a first clock frequency signal, the first frequency divider circuit having a first adjustable frequency division ratio;

a second frequency divider circuit coupled to the control unit for providing a second clock frequency signal, the second frequency divider circuit having a second adjustable frequency division ratio;

a reference meter coupled to the first and second frequency divider circuits and initiating a first time count in a forward direction using the first clock frequency signal when the first event signal is received by the control unit, the reference meter initiating a second time count in a reverse direction using the second clock frequency signal when the second event signal is received by the control unit, the second time count being continued until the third event signal is received by the control unit, the reference meter forming a comparison value for obtaining a ratio of the first time count between the first and the second event signals and the second time count between the second and third event signals when the third event signal is received by the control unit, the reference meter including a register, the register supplying the reference meter with a reset value when the first event signal is received by the control unit.

2. The electronic meter circuit as recited in claim 1, wherein the reset value is equal to zero.

3. The electronic meter circuit as recited in claim 1, further comprising a first gate supplying a first input clock pulse for generating the first clock frequency signal when the first event signal is received by the control unit.

4. The electronic meter circuit as recited in claim 1, further comprising a second gate supplying a second input clock pulse for generating the second clock frequency signal when the second event signal is received by the control unit.

5. The electronic meter circuit as recited in claim 1, wherein the reference meter is formed by a forward counting direction meter and a reverse counting direction meter.

6. The electronic meter circuit as recited in claim 5, wherein the forward counting direction meter counts up.

7. The electronic meter circuit as recited in claim 5, wherein the reverse counting direction meter counts down.

8. The electronic meter circuit as recited in claim 5, wherein the forward counting direction meter includes a first meter reading signal being supplied to the reverse counting direction meter when the second event signal is received by the control unit.

9. The electronic meter circuit as recited in claim 5, wherein the forward counting direction meter receives the reset value when the first event signal is received by the control unit.

10. The electronic meter circuit as recited in claim 1, wherein the reference meter is a mixed meter, the mixed meter receiving the first clock frequency signal for initiating an incremental counting operation, the mixed meter receiving the second clock frequency signal for initiating a decremental counting operation.

11. The electronic meter circuit as recited in claim 10, wherein the increment counting operation increments by one, and wherein the decremental counting operation decrements by one.

12. The electronic meter circuit as recited in claim 1, wherein the plurality of event signals are generated by a rotational angle generator and correspond to cyclic angle information of a machine unit.

13. The electronic meter circuit according to claim 12, wherein the machine unit includes a crankshaft of a combustion engine.

14. The electronic meter circuit according to claim 12, wherein the machine unit includes a camshaft of a combustion engine.

15. The electronic meter circuit as recited in claim 1, wherein the plurality of event signals are generated in a combustion engine having a crankshaft, the plurality of event signals being detected using a plurality of tooth spaces of an incremental generator signal wheel of the crankshaft, each tooth space generating an event signal.

16. The electronic meter circuit as recited in claim 1, wherein the plurality of event signals are generated in a combustion engine having a camshaft, the plurality of event signals being detected using a plurality of tooth spaces of an incremental generator signal wheel of the camshaft, each tooth space generating an event signal.

17. The electronic meter circuit as recited in claim 1, wherein the plurality of event signals are generated in a combustion engine having a crankshaft, the plurality of event signals being detected using a synchronization signal of a segment generator of the crankshaft.

18. The electronic meter circuit as recited in claim 1, wherein the plurality of event signals are generated in a combustion engine having a camshaft, the plurality of event signals being detected using a synchronization signal of a segment generator of the camshaft.

19. The electronic meter circuit as recited in claim 1, wherein the electronic meter circuit is used in a control device of a combustion engine to simulate a crankshaft.

20. The electronic meter circuit as recited in claim 1, wherein the electronic meter circuit is used in a control device of a combustion engine to simulate a camshaft.

* * * * *